(12) United States Patent
Cheng et al.

(10) Patent No.: US 8,518,767 B2
(45) Date of Patent: Aug. 27, 2013

(54) FINFET WITH REDUCED GATE TO FIN OVERLAY SENSITIVITY

(75) Inventors: Kangguo Cheng, Beacon, NY (US); Louis Lu-Chen Hsu, Fishkill, NY (US); Jack Allan Mandelman, Flatrock, NC (US); John Edward Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 1148 days.

(21) Appl. No.: 11/680,221

(22) Filed: Feb. 28, 2007

(65) Prior Publication Data
US 2008/0203468 A1    Aug. 28, 2008

(51) Int. Cl.
*H01L 21/336* (2006.01)
(52) U.S. Cl.
USPC ............................ 438/198; 257/E21.421
(58) Field of Classification Search
USPC ............... 257/E29.264, E29.275, E29.319, 257/E21.421, 666–677, 690–698; 438/198
See application file for complete search history.

(56) References Cited

U.S. PATENT DOCUMENTS

| | | | |
|---|---|---|---|
| 4,510,016 A * | 4/1985 | Chi et al. | 438/347 |
| 5,583,368 A | 12/1996 | Kenney | |
| 6,645,797 B1 | 11/2003 | Buynoski et al. | |
| 6,762,483 B1 | 7/2004 | Krivokapic et al. | |
| 7,029,958 B2 | 4/2006 | Tabery et al. | |
| 7,105,894 B2 | 9/2006 | Yeo et al. | |
| 7,494,858 B2 | 2/2009 | Bohr et al. | |
| 7,923,314 B2 * | 4/2011 | Tezuka et al. | 438/157 |
| 2003/0003759 A1 * | 1/2003 | Kudelka | 438/733 |
| 2007/0001173 A1 | 1/2007 | Brask et al. | |
| 2007/0272925 A1 | 11/2007 | Choi et al. | |
| 2008/0081404 A1 * | 4/2008 | Barna et al. | 438/197 |
| 2008/0203468 A1 | 8/2008 | Cheng et al. | |
| 2012/0146112 A1 | 6/2012 | Cheng et al. | |

FOREIGN PATENT DOCUMENTS

| | | |
|---|---|---|
| JP | 9023011 A | 1/1997 |
| JP | 2001298194 A | 10/2001 |
| JP | 2002009289 A | 1/2002 |
| JP | 2002118255 A | 4/2002 |
| JP | 2005129654 A | 5/2005 |
| JP | 2006013303 A | 1/2006 |
| JP | 2006310594 A | 11/2006 |
| WO | 2005078804 A1 | 8/2005 |

OTHER PUBLICATIONS

Liu et al. "Fin-type Douple-Gate Metal-Oxide-Semiconductor Field-Effect Transistors Fabricated by Orientation-Dependent Etching and Electron Beam Lithography," Jpn. J. Appl. Phys. vol. 42 4142-4146 (2003).*

(Continued)

*Primary Examiner* — Matthew Reames
(74) *Attorney, Agent, or Firm* — Patterson & Sheridan LLP

(57) ABSTRACT

Embodiments of the invention provide a relatively uniform width fin in a Fin Field Effect Transistors (FinFETs) and apparatus and methods for forming the same. A fin structure may be formed such that the surface of a sidewall portion of the fin structure is normal to a first crystallographic direction. Tapered regions at the end of the fin structure may be normal to a second crystal direction. A crystallographic dependent etch may be performed on the fin structure. The crystallographic dependent etch may remove material from portions of the fin normal to the second crystal direction relatively faster, thereby resulting in a relatively uniform width fin structure.

24 Claims, 6 Drawing Sheets

(56) References Cited

OTHER PUBLICATIONS

Liu, Yongxun et al., "Fin-Type Double-Gate Metla-Oxide-Semicondoctor Field-Effect Transistors Fabricated by Orientation-Dependent Etching and Electron Beam Lithography", Japanese Journal of Applied Physics, Jun. 2003, pp. 4142-4146, vol. 42, The Japan Society of Applied Physics, Tokyo, Japan.

* cited by examiner

FINFET WITH REDUCED GATE TO FIN OVERLAY SENSITIVITY

BACKGROUND OF THE INVENTION

1. Field of the Invention

The present invention is generally related to Field Effect Transistors, and more specifically to Fin Field Effect Transistors (FinFETs).

2. Description of the Related Art

Over the past few decades, the speed and density of transistors in integrated circuits has continued to increase in accordance with Moore's law, which predicts exponential growth. Consequently, integrated circuits such as microprocessors have delivered greater functionality and performance at a lower cost. As devices on integrated circuits, for example, transistors have become smaller, faster, and cheaper, the use of integrated circuits has become more widespread. Furthermore, the demand for improved performance of integrated circuits continues to grow. As a result, innovative technologies for constructing faster and smaller transistors continue to be developed and adopted.

Fin Field Effect Transistor (FinFET) technology is one such innovative approach to construct high performance transistors on integrated circuits. A FinFET is a double gate structure that is easily manufactured using current fabrication techniques. In a FinFET, a vertical fin is defined to form the body of a transistor. Gates can be formed on one or both sides of the vertical fin. When both sides of the vertical fin have a gate formed thereon, the transistor is generally referred to as a double-gate FinFET. A double-gate FinFET helps suppress short channel effects (SCE), reduce leakage, and enhance switching behavior. Also, a double gate FinFET can increase the electrical width of the transistor.

As circuit densities continue to increase, the length of the fin has continued to decrease in order to scale FinFET devices. One problem with scaling FinFET devices is that the width of a fin is not uniform along the entire length of the fin. The width of the fin may especially deviate from ideal conditions at the ends of the fin, for example. The deviation from ideal fin dimensions may occur along the ends of the fin due to, for example, chip lithographic or etch variations.

Furthermore, as the fin size continues to shrink, the danger of overlaying a gate structure over an irregular area of the fin greatly increases. Variations in the particular area of a fin structure over which a gate structure is formed may occur due to a number of factors such as simple translational displacement between mask levels due to misalignment, optical distortions, magnification errors, and the like. The shrinking of fin length may also increase the probability that a gate structure is formed at or near an end of the fin structure where the fin width is too wide and/or changing along the length of the fin.

In some cases, fin irregularities may result in fin width being different on opposite sides of a gate structure. Consequently, the gate control of the silicon fin may differ between source and drain edges of the gate structure, resulting in degraded and unpredictable electrical behavior. Variations in fin width may also result in variations in threshold voltages and sub-Vt swing.

One solution to the aforementioned problems is to increase fin length, thereby reducing the probability of overlaying a gate structure at or near an end of the fin, where fin width is most likely to be irregular. However, increasing fin length results in increased series resistance along the channel of the FinFET, in addition to decreased device densities on the integrated circuit.

Therefore, there is a need for improved methods for forming FinFETs with short fins of uniform width.

SUMMARY OF THE INVENTION

The present invention is generally related to Field Effect Transistors, and more specifically to Fin Field Effect Transistors (FinFETs).

One embodiment of the invention provides a method for fabricating a Fin Field Effect Transistor. The method generally comprises forming a fin structure on a semiconductor substrate, wherein a sidewall portion of the fin structure is normal to a first crystal direction, the fin structure further comprising a tapered region at least one end of the fin structure, wherein a sidewall portion of the tapered region is normal to a second crystal direction. The method further comprises performing a crystallographic dependent etch on the FinFET, wherein the crystallographic dependent etch etches surfaces normal to the second crystal direction relatively faster than surfaces normal to the first crystal direction, the crystallographic dependent etch shaping the fin structure to have a substantially uniform width along a length of the fin structure.

Another embodiment of the invention provides a method for shaping a semiconductor structure. The method generally comprises performing a crystallographic dependent etching procedure on the semiconductor structure having a first surface normal to a first crystal direction (e.g., a sidewall portion of the semiconductor structure) and a second surface normal to a second crystal direction (e.g., a sidewall portion of a tapered region of the semiconductor structure). The crystallographic dependent etching procedure etches the second surface of the semiconductor structure normal to the second crystal direction relatively faster than the first surface of the semiconductor structure normal to the first crystal direction.

Yet another embodiment of the invention provides a FinFET device, generally comprising a body comprising a fin structure and a gate structure formed adjacent to the fin structure, a source region disposed on a first side of the body and adjacent to a first end of the fin structure, and a drain region disposed on a second side of the body and adjacent to a second end of the fin structure. The interface of the fin structure at the source region and the first end of the fin structure and the interface of the fin structure at the drain region and the second end of the fin structure may form substantially orthogonal corners.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

The present invention is generally related to Field Effect Transistors, and more specifically to Fin Field Effect Transistors (FinFETs). A fin structure may be formed such that the surface of a sidewall portion of the fin structure is normal to a first crystallographic direction. Tapered regions at the end of the fin structure may be normal to a second crystal direction. A crystallographic dependent etch may be performed on the fin structure. The crystallographic dependent etch may remove material from portions of the fin normal to the second crystal direction relatively faster, thereby resulting in a relatively uniform width fin structure.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Exemplary FinFET Structure

Figure 1:
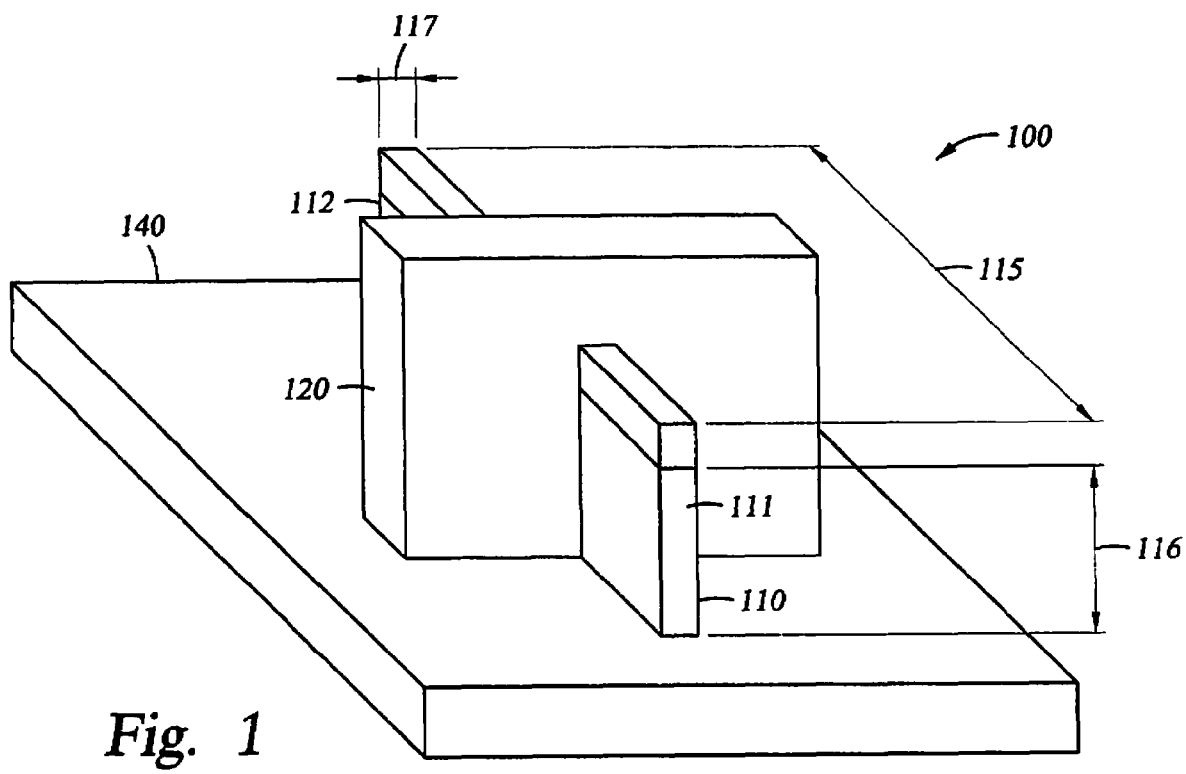
FIG. 1 illustrates an exemplary three dimensional view of a FinFET device according to an embodiment of the invention.

FIG. 1 illustrates a three dimensional view of an exemplary FinFET transistor 100, according to an embodiment of the invention. FinFET 100 may be formed on a substrate 140 as illustrated in FIG. 1. Substrate 140 may be made from any suitable semiconductor material, for example, silicon, germanium, silicon germanium, gallium arsenic, indium phosphorus, and the like. Substrate 140 may be a bulk silicon substrate, a Silicon-On-Insulator (SOI) substrate, or an insulating substrate.

FinFET 100 may include a fin structure 110 and a gate structure 120. Fin structure 110 may also be made from any suitable semiconductor material, for example, silicon, germanium, silicon germanium, gallium arsenic, indium phosphorus, and the like. Fin Structure 110 may or may not be made from the same semiconductor material as the substrate 140.

As illustrated in FIG. 1, fin structure 110 may be a narrow elevated channel on a substrate 140 upon which FinFET transistor 100 is formed. At one end 111, fin structure 110 may be coupled with a source region (not shown in FIG. 1) of FinFET 100. At an opposite end 112, fin structure 110 may be coupled with a drain region (not shown in FIG. 1) of FinFET 100. Therefore, fin structure 110 may function as a channel connecting the source and drain regions of FinFET 100.

An optional nitride layer 150 may be disposed on the fin structure 110 as illustrated in FIG. 1 to facilitate the device formation. By using a nitride layer 150 the contributions of the top surface and top corners of the fin to the channel current may be minimized. The nitride layer may result in channel current contributed predominantly by the sides of the fin, thereby improving reproducibility of the electrical characteristics of the transistor.

Fin structure 110 may have a length 115, a height 116, and a width 117, as illustrated in FIG. 1. The values of length 115, height 116, and the width 117 may be selected based on a particular function of FinFET 100. In one embodiment of the invention, fin structure 110 may be less than 20 nm wide. In general, device scaling for increasing integrated circuit density may involve scaling down any one of the dimensions of the fin structure 110. For example, scaling down the size of FinFET 100 may involve scaling down the fin length 115.

Forming fin structure 110 may involve forming a plurality of mask layers, for example, oxide and nitride layers, over the substrate 140 and forming an aperture in the plurality of oxide and nitride layers such that the substrate 140 is exposed by the aperture. In one embodiment, the aperture may have dimensions of the desired fin structure. A semiconductor material may be epitaxially grown in the aperture, and the plurality of oxide and nitride layers may be removed to form the fin structure 110 illustrated in FIG. 1.

Gate structure 120 may be disposed along at least one face of fin structure 110. For example, in FIG. 1, gate structure 120 is disposed along the three faces, i.e. the top face and the side faces of fin structure 110. For the exemplary structure in FIG. 1, the presence of the nitride layer may reduce the contribution of the top face to the total channel current. In other contemplated embodiments, the nitride layer may be absent from the top face. It is noteworthy that the gate structure 120 may be disposed on any number of faces of fin structure 110. For example, gate structure 120 may surround all faces of fin structure 110, or gate structure 120 may be disposed on the two side faces of fin structure 110.

In one embodiment of the invention, gate structure 120 may be made from one of polysilicon or amorphous silicon. Gate structure 120 may be formed by a suitable process known in the art, for example, Low Pressure Chemical Vapor Deposition (LPCVD).

The narrowness of fin structure 110 and the gating of fin structure 110 with gate structure 120 on at least two faces of fin structure 110 may provide greatly reduced short channel sensitivity and improved scalability of channel length. Furthermore, gate structure 120 may maintain a strong control of semiconductor potential and may screen a transistor source from penetrating into a transistor drain electric field. Such strong gate control may enable near ideal sub-threshold (Vt) swing, as well as reduced sensitivity of threshold (Vt) to drain voltage and channel length variations.

In one embodiment of the invention, FinFET 100 may be operated in a fully depleted mode, resulting in volume inversion and increased current drive in comparison to conventional planar single gated MOSFETs.

Figure 2:
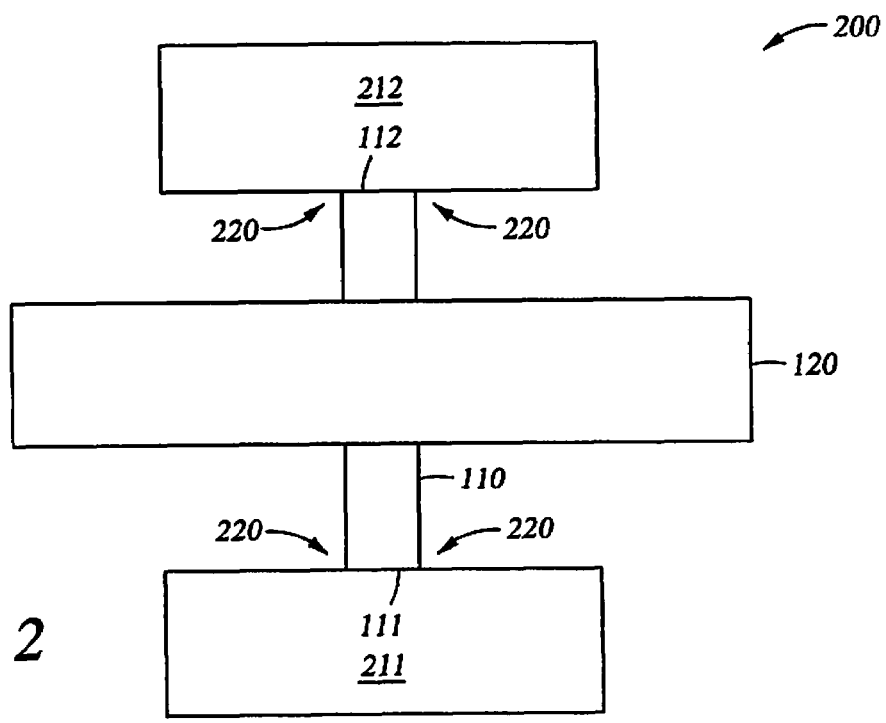
FIG. 2 illustrates a top view of an exemplary ideal FinFET device according to an embodiment of the invention.

FIG. 2 illustrates a top view of an ideal FinFET device 200 according to an embodiment of the invention. Ideal FinFET device 200 may include a narrow fin structure 110, gate structure 120, source contact region 211, and drain contact region 212. Source contact region 211 may be coupled with fin structure 110 at an end 111 of fin structure 110. Drain contact region 212 may be coupled with fin structure 110 at an end 112 of fin structure 110, as illustrated in FIG. 2. As illustrated in FIG. 2, the source contact region 211 and drain contact region 212 may be relatively much wider than the fin width 117.

As illustrated in FIG. 2, in an ideal FinFET device 200, gate structure 120 may be disposed orthogonal to and along the center of the fin structure 110. Furthermore, the width 117 is uniform along the length of fin structure 110. Therefore, junctions 220, where fin structure 110 connects with source contact region 211 and drain contact region 212, form perfect right-angled inner corners.

Figure 3:
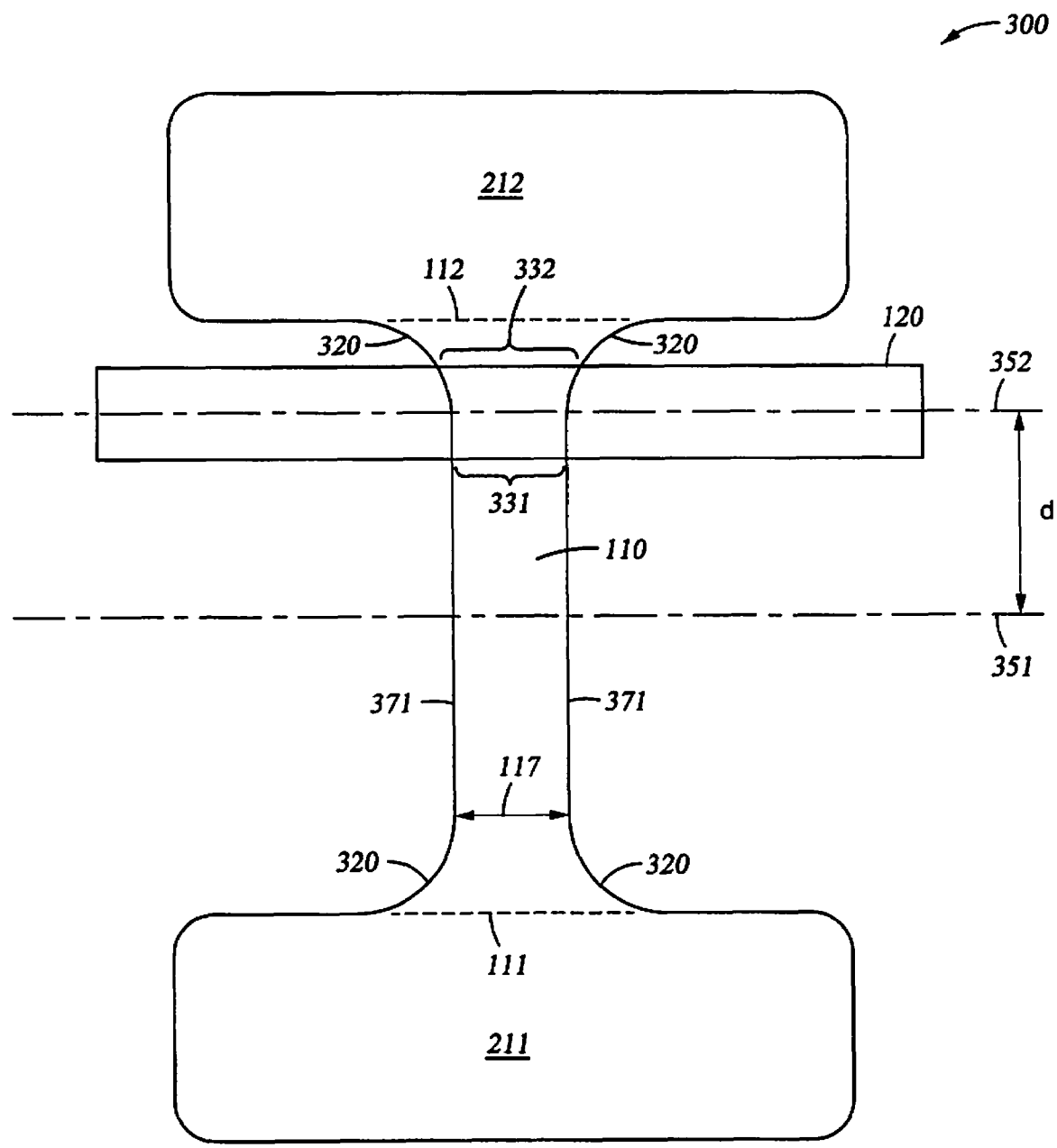
FIG. 3 illustrates a top view of an actual FinFET device according to an embodiment of the invention.

However, an actual FinFET device may differ from the ideal FinFET device 200 in many aspects. FIG. 3 illustrates an exemplary actual FinFET device 300. For example, as illustrated in FIG. 3, gate structure 120 may be displaced from the center 351 of fin structure 110 by a distance d. Therefore, an axis 352 of gate structure 120 may be disposed closer to one of source contact region 211 or drain contact region 212.

Gate structure 120 may be disposed away from the center 351 of fin structure 110 due to a wide variety of reasons, for example, simple translational displacement between mask levels due to misalignment, optical distortions, magnification errors, and the like. A gate alignment tolerance value may define a displacement distance range relative to the center of the fin 351 within which gate structure 120 may be formed on a fin structure 110 based on the particular procedures used to form components of FinFET 300.

Another difference between ideal FinFET device 200 and actual FinFET structure 300 is that the fin width 117 may not be uniform along the length of fin structure 110. For example, at the end 111 where fin 110 is coupled with source contact region 211 and at the end 112 where fin 110 is coupled with drain contact region 212, the edges of fin 110 may flare to create tapered and rounded inside edges 320. As illustrated in FIG. 3, the tapered inside edges 320 result in a gradual transition from a narrow fin 110 to the source contact region 211 and drain contact region 212. The tapered edges 320 may be formed, for example, as a result of lithographic and etch variations while forming components of FinFET 300.

In the ideal FinFET 200, displacement of the gate structure 120 along the length of fin structure 110 may not have any significant effect on the performance of FinFET 200 because the width 117 is uniform along the length of fin 110. However, displacement of gate structure 120 along the length of fin 110 in FinFET 300 may result in the gate structure 120 being formed over a tapered region 320. As a result, the width of the fin structure 110 on one side of gate structure 120 may vary from the width of fin structure 110 on the other side of gate structure 120. For example, in FIG. 3, the width of fin structure 110 on a side 332 of gate structure 120 is larger than the width of fin structure 110 on an opposite side 331 of gate structure 120.

Such a discrepancy between the fin widths on either side of gate structure 120 may mean that gate control of fin structure 110 would differ between the source and drain edges of gate structure 120, thereby resulting in degraded and unpredictable performance. Because the electrical characteristics of FinFET devices, for example, threshold voltage and sub-Vt swing, are highly sensitive to variations in the width of fin structure 110, such variations are not desired.

With increasing circuit densities, fin lengths continue to shrink, thereby bringing the tapered regions 320 within the gate alignment tolerance range and increasing the probability of a gate structure 120 being placed over a tapered corner 320. Therefore embodiments of the invention provide methods for shaping the rounded corners 320 to form relatively uniform width fin structures.

Forming a Uniform Width Fin

In one embodiment of the invention, the process for forming the inventive FinFET device may begin by performing known process steps to form the source, drain, and fin regions on a bulk silicon or SOI substrate. For example, in one embodiment, the fin structure 110, source region 211, and drain regions 212 illustrated in FIG. 2 may be defined by a subtractive directional etching process, for example, Reactive Ion Etching (RIE). Alternatively, the fin structure 110, source region 211, and drain region 212 may be formed by selective epitaxial growth of a semiconductor material through an aperture formed in a hard mask layer, followed by polishing of the overgrowth. The hard mask layer may comprise a plurality of oxide and nitride layers. Standard lithography or image transfer techniques may be used to define the fin, source, and drain region patterns.

In one embodiment of the invention, fin structure 110 may be formed such that it is oriented in a particular crystal direction with respect to the crystal axes. For example, referring to FIG. 3, the sides 371 of fin structure 110 may be formed such that the surface normal to the sides 371 is in a predetermined crystallographic direction.

Crystal directions and planes may be defined for crystalline materials which contain atoms arranged in a periodic fashion. Crystalline materials typically contain a basic unit cell which may repeat in all three dimensions. The particular orientation of crystal directions and planes at the surface of semiconductor materials may affect the electrical, physical and chemical properties of the semiconductor material at the surface where incompletely bonded atoms may exist.

Figure 4:
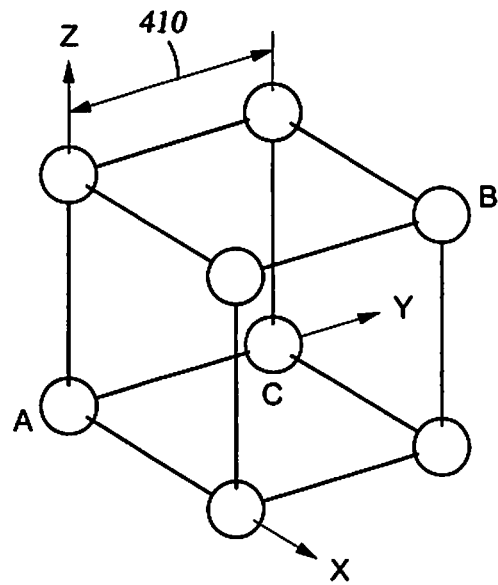
FIG. 4 illustrates an exemplary cubic crystal structure according to an embodiment of the invention.

FIG. 4 illustrates a simple exemplary crystal cubic unit cell structure 400. A dimension 410, known as the lattice constant may define a basic distance over which the unit cell structure may repeat itself. A three dimensional coordinate system, for example, a rectangular (x, y, z) coordinate system, may define directions in the crystal. For example, directions in a crystal may be defined in terms of three integers representing a vector in a given direction.

The vector may define a direction for moving from one atom in the unit cell structure to another atom in the unit cell structure. For example, if a movement of one unit in each of the x, y, and z direction id required to move from a first atom to a second atom in the unit cell structure, then the crystal direction may be [111]. If moving from one atom to another atom in the unit cell structure requires a movement of one unit in the x and y direction, but no movement in the z direction, then the crystal direction may be [110].

Due to symmetry, many directions in a crystal may be equivalent, and may depend on the particular choice of reference. For example, the [100], [010], and [001] directions may be equivalent. Equivalent directions may be identified as a family of directions. For example, [100], [010], and [001] directions, by convention, may be referred to as the <100> directions. The use of angled brackets instead of square brackets while referring to crystal directions may differentiate a family of directions from a particular direction in the family of directions.

Figure 5A:
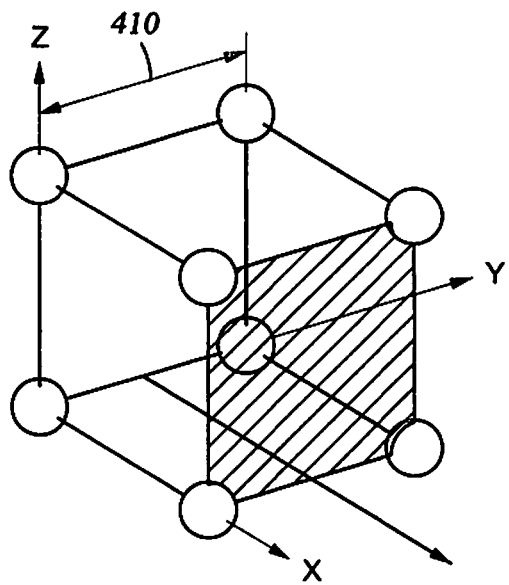
FIGS. 5A-C illustrate exemplary crystal planes according to an embodiment of the invention.
Figure 5B:
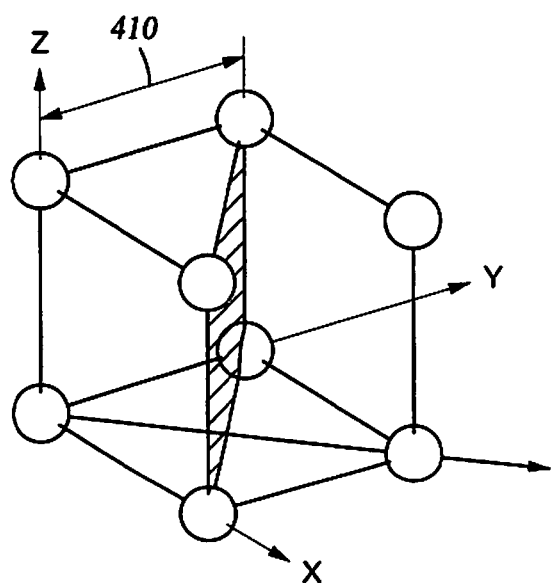
Figure 5C:
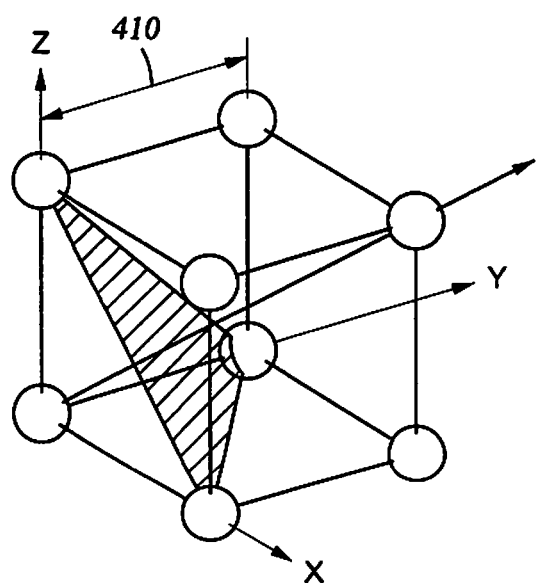

FIGS. 5A-C illustrate three exemplary crystal planes defined for the simple cubic structure illustrated in FIG. 4. The crystal planes may be described by their miller indices. For example, FIG. 5A illustrates a (100) plane, FIG. 5B illustrates a (110) plane, and FIG. 5C illustrates a (111) plane.

The miller indices for a plane may be determined based on the intercepts of a plane with the x, y, and z axes. For example, (110) plane in FIG. 5B intersects the x, y and z axes at 1, 1, and ∞ respectively. The miller index for the plane may be determined by the reciprocal of the intercepts. Therefore, the miller index for the plane illustrated in FIG. 5B is (110).

As with crystal directions, crystal planes may be equivalent based on the point of reference. Accordingly, the (110), (101), and (011) planes for example, may be equivalent. Equivalent planes may be referred to as a family of planes. For example, (110), (101), and (011) planes by convention, may be referred to as the {110} planes. The use of curly brackets instead of parenthesis while referring to crystal planes may differentiate a family of planes from a particular plane in the family of planes.

In cubic lattices, a crystal direction in a direction represented by integers [$x_1\ y_1\ z_1$] is perpendicular to a plane identified with the same integers ($x_1\ y_1\ z_1$). For example, direction [110] may be perpendicular to plane (110). One skilled in the art will recognize that the exemplary cubic crystal structure illustrated in FIGS. 4 and 5A-C are for illustration of crystal directions and planes only. Crystal directions and planes may similarly be defined for more complex crystal structures, for example, silicon.

Figure 6:
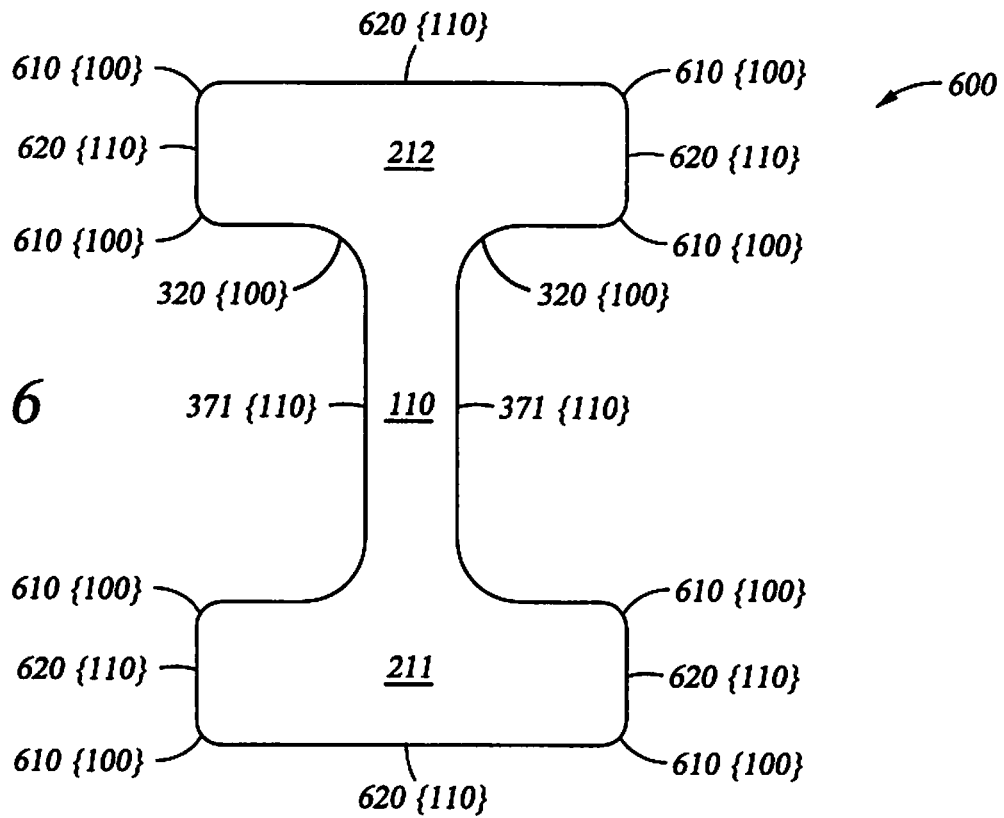
FIG. 6 illustrates another top view of an exemplary FinFET device according to an embodiment of the invention.

FIG. 6 illustrates crystal directions along faces of a FinFET 600 comprising a fin structure 110, source region 211, and drain region 212 according to an embodiment of the invention. As illustrated in FIG. 6, in one embodiment of the invention, fin structure 110 may be formed such that the sides 371 of the fin structure 110 are normal to the <110> crystallographic direction. In other words, the sides 371 are along a {110} plane as illustrated in FIG. 5. The sides 620 of source region 211 and drain region 212 may also be normal to the <110> direction, as illustrated in FIG. 6. As illustrated in FIG. 6, the tapered regions 320 of fin structure 110 and rounded corners 610 of source region 211 and drain region 212 may generally be disposed normal to the <100> direction.

In one embodiment of the invention, a crystallographic etch may be performed on the FinFET structure 600 illustrated in FIG. 6 to shape the tapered regions 320, thereby forming a relatively uniform width fin structure 110. In one embodiment, prior to performing the crystallographic etch, the FinFET 600 may be cleaned to remove any impurities, for example, organic particles, along the sidewall portions 371 and 620, tapered regions 320, and rounded corners 610 of FinFET 600.

In one embodiment of the invention FinFET structure 600 may be cleaned. For example, a first solution containing $H_2O$—$NH_4OH$—$H_2O_2$ (SC-1 clean) may be used to remove organic contaminants and particles. A second solution containing $H_2O$—HCl—$H_2O_2$ (SC-2 clean) may be used to remove metal contaminants. Deionized water rinse or a dilute hydrofluoric acid rinse can be performed before or after each clean. Furthermore, a solution containing sulfuric peroxide ($H_2SO_4$—$H_2O_2$—$H_2O$) may be used before the SC-1 clean to remove organic contaminants.

In one embodiment of the invention, after cleaning, FinFET structure 600 may be deglazed to remove any oxide layer that may have formed on the surface of the sidewall portions 371 and 620, tapered regions 320, and rounded corners 610 of FinFET 600. In one embodiment of the invention, FinFET structure may be deglazed using dilute hydrofluoric acid (DHF). For example, in a particular embodiment, 300:1 DHF for 180 seconds may be used in the deglazing process.

A crystallographic dependent etch may be performed on the FinFET 600 using a suitable etching agent. For example, in one embodiment, an aqueous etchant containing ammonia may be used as the etchant. The selection of etchant may be such that the etchant etches {100} planes much faster than the {110} planes. For example, in one embodiment, dilute ammonium hydroxide may be used as the etchant. In a particular embodiment, a 50:1 ammonium hydroxide ($NH_4OH$) solution for 60 seconds may be used as the etchant. Alternatively, Potassium Hydroxide (KOH), Tetramethylammonium Hydroxide (TMAH), Hydrazine, or Ethylene Diamine Pyrocatechol (EDP) may also be used as the etchant.

Because the etchant is selected to etch {100} planes faster than {110} planes, the crystallographic dependent etch etches away the tapered regions 320 faster than the side wall regions 371, thereby shaping fin structure 110 to have a relatively uniform width along the length of the fin structure 110. For example, in one embodiment, the etchant may etch {100} planes 50 times faster than {110} planes. As a result, more semiconductor material may be removed from tapered regions 320 than from the side wall regions 371 of fin structure 110. In some embodiments, around 25 nm of semiconductor material may be removed from the surface of a {100} plane, while only 0.25 nm of semiconductor material is removed from the surface of a {110} plane.

Figure 7:
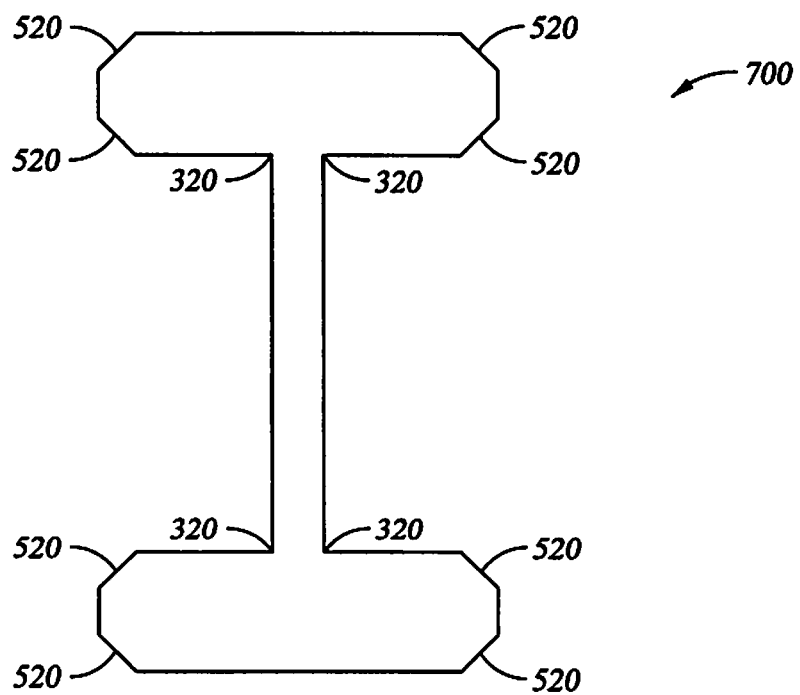
FIG. 7 illustrates a top view of an exemplary FinFET device after crystallographic etching, according to an embodiment of the invention.

FIG. 7 illustrates an exemplary FinFET 700 according to an embodiment of the invention. FinFET 700 depicts the structure of FinFET 600 of FIG. 6 after a crystallographic etch process is performed on FinFET 600. As illustrated in FIG. 7, the tapered regions 320 are shaped by the crystallographic etching to form nearly rectangular corners at the interface of the fin structure 110 and the source region 211 or drain region 212.

Furthermore, the higher etching rate on the surface of {100} planes may cause the previously rounded corners 520 to become cropped. The cropping of the rounded corners 520 may result in reduced junction capacitance and improved performance of the FinFET 700.

Figure 8:
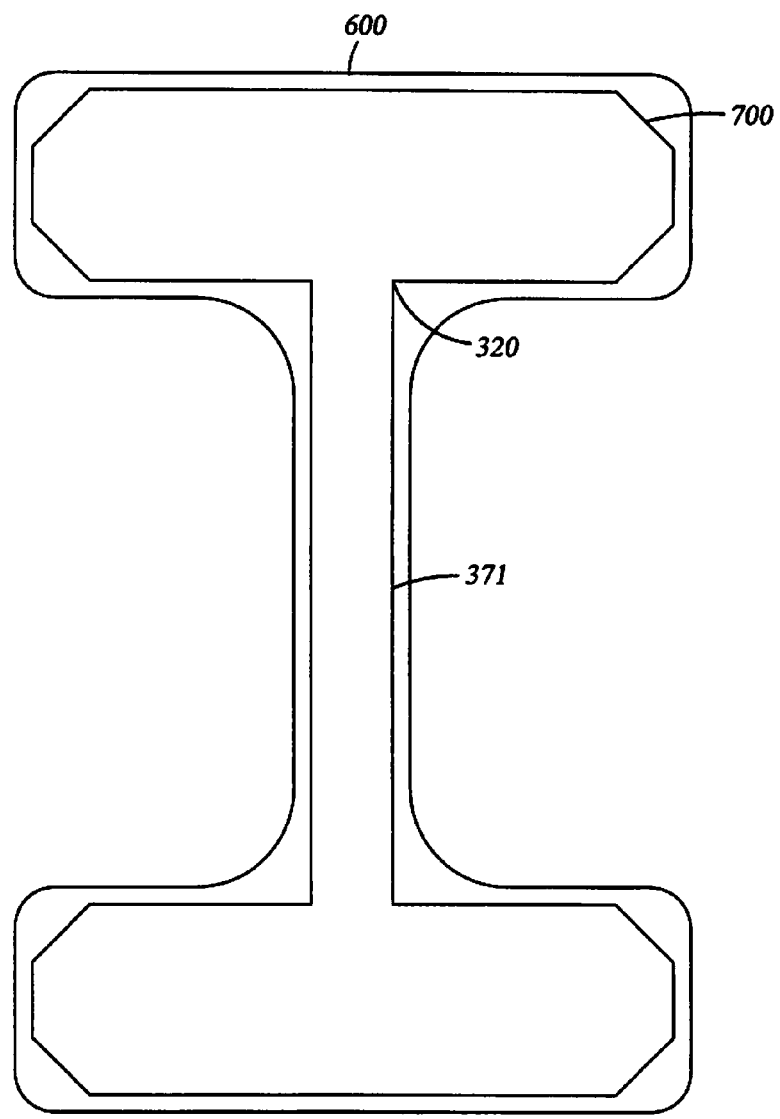
FIG. 8 illustrates exemplary shapes of a FinFET device before and after crystallographic etching, according to an embodiment of the invention.

FIG. 8 illustrates the shape of FinFET 700 overlaid on the shape of a FinFET 600. As illustrated in FIG. 8, the crystallographic etching process removes a greater amount of silicon from the tapered regions 320 than from the side wall regions 371, thereby forming a relatively uniform width fin structure 110. Because fin width of fin structure 110 is slightly smaller in fin structure 700 in comparison fin structure 600, the initial fin width of fin structure 600 may be selected to allow for loss of fin width during crystallographic etching.

After a crystallographic etch is performed, a FinFET structure 700 may be cleansed again to remove any residual particles from the etching process. For example, in one embodiment, FinFET 700 may be cleaned using SC-1, SC-2, and/or deionized water rinse.

Figure 9:
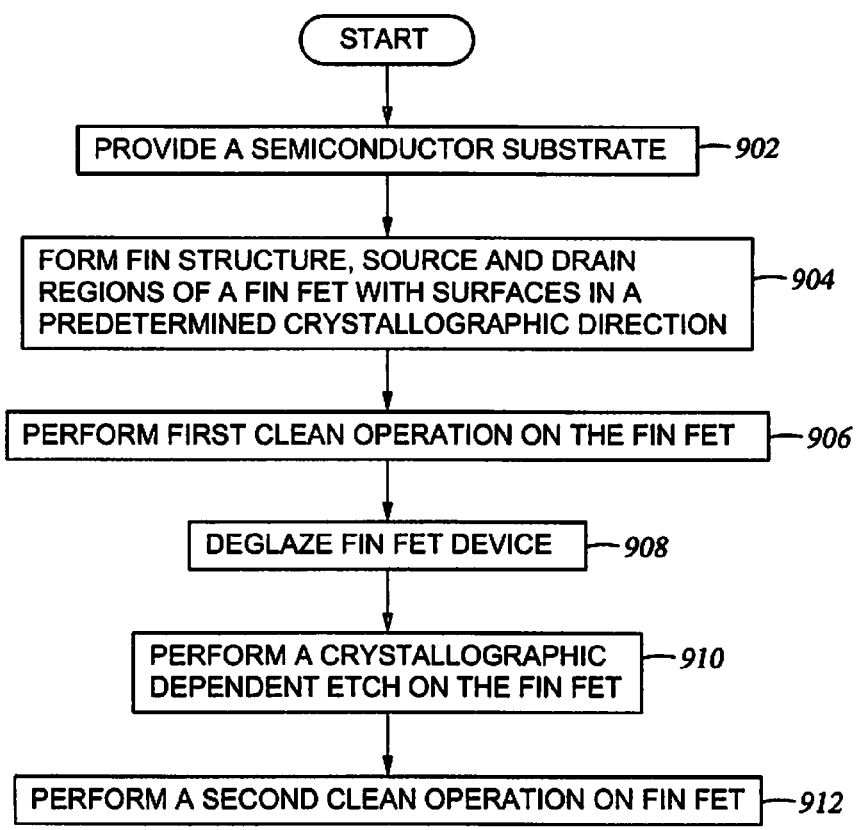
FIG. 9 is a flow diagram of exemplary operations performed to shape a fin structure according to an embodiment of the invention.

FIG. 9 is a flow diagram of exemplary operations performed to shape a fin structure 110 to form a relatively uniform width fin. The operations may begin in step 902 by providing a semiconductor substrate. The semiconductor substrate may be a bulk silicon substrate or a SOI substrate. In step 904, a FinFET device comprising a fin structure 110, source region 211, and drain region 212 may be formed on the substrate using conventional fabrication methods. The fin structure may be formed such that the surface of one or more sidewalls of the fin structure are normal to a predetermined crystallographic direction, as described above. For example, a sidewalls 371 of fin structure 110 may be normal to the <110> crystal direction. The tapered regions 320 of fin structure 110 may be generally normal to the <100> crystal direction.

In step 906, an optional first clean operation may be performed on the FinFET device to prepare the FinFET for a crystallographic etch. For example, the FinFET may be cleaned using SC-1. In step 908, the FinFET device may be deglazed to remove any oxide layer that may have formed on the surfaces of the fin structure. In one embodiment, the FinFET device may be deglazed using dilute hydrofluoric acid.

In step 910, the fin structure may be shaped in a crystallographic dependent etching process. The crystallographic etching process may involve exposing the surfaces of the fin structure to an aqueous etchant comprising ammonia. The etchant may be configured to etch surfaces normal to a first crystallographic direction faster than a surface normal to a second crystallographic direction. For example, the etchant may etch the surface of the tapered region 320 faster than the sidewall 371 surface of the FinFET device, thereby shaping the fin structure to form a relatively uniform width fin.

In step 912, a second clean operation may be performed on the FinFET to remove any residual particles from the crystallographic dependent etching process. In one embodiment, the post etching cleaning may involve the use of SC-1 and water.

CONCLUSION

By providing a method to shape a fin structure to form a relatively uniform width fin structure in a FinFET device, some embodiments of the invention may eliminate the undesirable effects of gate to fin overlay sensitivity, thereby allowing fabrication of relatively shorter fins that reduce series resistance, improve performance, and allow higher layout density. Furthermore, fin shaping may crop portions of source and drain contact regions, thereby reducing junction capacitance and improving performance further.

While the foregoing is directed to embodiments of the present invention, other and further embodiments of the invention may be devised without departing from the basic scope thereof, and the scope thereof is determined by the claims that follow.

What is claimed is:

1. A method for fabricating a Fin Field Effect Transistor (FinFET), the method comprising:
    forming a fin structure on a semiconductor substrate, wherein a sidewall portion of the fin structure is normal to a <110> crystal direction, the fin structure further comprising a tapered region at at least one end of the fin structure, wherein a sidewall portion of the tapered region is normal to a <100> crystal direction; and
    performing a crystallographic dependent etch on the fin structure, wherein the crystallographic dependent etch etches surfaces normal to the <100> crystal direction relatively faster than surfaces normal to the <110> crystal direction.

2. The method of claim 1, further comprising forming a source region adjacent to a first end of the fin structure and a drain region adjacent to a second end of the fin structure, the source region and the drain region comprising at least one rounded corner region, a sidewall portion of the corner region being normal to the <100> crystal direction, wherein the crystallographic dependent etch crops the at least one rounded corner region.

3. The method of claim 1, further comprising cleaning the fin structure prior to performing the crystallographic dependent etch, wherein the cleaning removes particles from the surfaces of the fin structure.

4. The method of claim 3, wherein the FinFET is cleaned using at least one of $H_2O$—$NH_4OH$—$H_2O_2$ solution, $H_2O$—$HCl$—$H_2O_2$ solution, and $H_2SO_4$—$H_2O_2$—$H_2O$ solution.

5. The method of claim 1, further comprising deglazing the fin structure prior to performing the crystallographic dependent etch, wherein the deglazing removes oxide layers formed on the fin structure.

6. The method of claim 5, wherein the FinFET is deglazed using dilute hydrofluoric acid.

7. The method of claim 1, wherein the crystallographic dependent etch is performed using an aqueous etchant comprising ammonia.

8. The method of claim 1, wherein the crystallographic dependent etch is performed using any one of:
    ammonium hydroxide;
    potassium hydroxide;
    tetramethylammonium hydroxide;
    hydrazine; and
    ethylene diamine pyrocatechol.

9. The method of claim 1, further comprising cleaning the fin structure after performing the crystallographic dependent etch, wherein the cleaning removes particles formed during etching.

10. The method of claim 9, wherein the FinFET is cleaned using one of one of $H_2O$—$NH_4OH$—$H_2O_2$ solution, $H_2O$—$HCl$—$H_2O_2$ solution, $H_2SO_4$—$H_2O_2$—$H_2O$ solution, and deionized water.

11. A method for shaping a semiconductor structure including at least one tapered region, the method comprising:
    performing a crystallographic dependent etching procedure on the semiconductor structure, wherein the crystallographic dependent etching procedure etches a first surface of the semiconductor structure normal to a <100> crystal direction relatively faster than a second surface of the semiconductor structure normal to a <110> crystal direction, wherein the first surface is a surface of the at least one tapered region, wherein the at least one tapered region is at at least one end of the semiconductor structure, and wherein the crystallographic dependent etching procedure removes at least a portion of the at least one tapered region.

12. The method of claim 11, wherein the semiconductor structure is a rectangular structure.

13. The method of claim 12, wherein the rectangular structure is a fin structure of a Fin Field Effect Transistor (FinFET).

14. The method of claim 13, wherein removing the at least one tapered region creates a uniform width along a length of the fin structure.

15. The method of claim 11, wherein the semiconductor structure is a rectangular structure, and wherein the crystallographic dependent etching procedure crops at least one corner region of the semiconductor structure.

16. The method of claim 15, wherein the semiconductor structure is one of a source region of a transistor and a drain region of a transistor.

17. The method of claim 11, further comprising cleaning the semiconductor structure prior to performing the crystallographic dependent etching procedure, wherein the cleaning removes particles from the surfaces of the semiconductor structure.

18. The method of claim 17, wherein the semiconductor structure is cleaned using at least one of $H_2O$—$NH_4OH$—$H_2O_2$ solution, $H_2O$—$HCl$—$H_2O_2$ solution, and $H_2SO_4$—$H_2O_2$—$H_2O$ solution.

19. The method of claim 11, further comprising deglazing the semiconductor structure prior to performing the crystallographic dependent etching procedure, wherein the deglazing removes oxide layers formed on the semiconductor structure.

20. The method of claim 19, wherein the semiconductor structure is deglazed using dilute hydrofluoric acid.

21. The method of claim 11, wherein the crystallographic dependent etching procedure is performed using an aqueous etchant comprising ammonia.

22. The method of claim 11, wherein the crystallographic dependent etching procedure is performed using any one of:
   ammonium hydroxide;
   potassium hydroxide;
   tetramethylammonium hydroxide;
   hydrazine; and
   ethylene diamine pyrocatechol.

23. The method of claim 11, further comprising cleaning the semiconductor structure after performing the crystallographic dependent etching procedure, wherein the cleaning removes particles formed during etching.

24. The method of claim 23, wherein the semiconductor structure is cleaned using one of supercritical-1 and water.

* * * * *